(12) United States Patent
Costa et al.

(10) Patent No.: US 10,587,229 B1
(45) Date of Patent: Mar. 10, 2020

(54) MULTI-STAGE STACKED POWER AMPLIFIER FEEDBACK CIRCUIT FOR IMPROVED PERFORMANCE

(71) Applicant: pSemi Corporation, San Diego, CA (US)

(72) Inventors: Damian Costa, San Diego, CA (US); Chih-Chieh Cheng, Poway, CA (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/216,896

(22) Filed: Dec. 11, 2018

(51) Int. Cl.
| *H03F 1/56* | (2006.01) |
| *H03F 3/24* | (2006.01) |
| *H04B 1/04* | (2006.01) |
| *H04M 1/02* | (2006.01) |

(52) U.S. Cl.
CPC ............ *H03F 1/565* (2013.01); *H03F 3/245* (2013.01); *H04B 1/04* (2013.01); *H03F 2200/222* (2013.01); *H03F 2200/387* (2013.01); *H03F 2200/451* (2013.01); *H04M 1/0202* (2013.01)

(58) Field of Classification Search
CPC combination set(s) only.
See application file for complete search history.

(56) References Cited

U.S. PATENT DOCUMENTS

| 4,206,419 | A | * | 6/1980 | Yokoyama | H03F 1/34 330/156 |
| 5,376,895 | A | * | 12/1994 | Aihara | H03G 3/3047 330/129 |
| 5,808,511 | A | * | 9/1998 | Kobayashi | H03G 7/08 330/149 |
| 7,248,120 | B2 | | 7/2007 | Burgener et al. | |
| 9,024,700 | B2 | | 5/2015 | Ranta | |
| 9,197,194 | B2 | | 11/2015 | Reedy et al. | |
| 9,219,445 | B2 | | 12/2015 | Nobbe et al. | |
| 9,276,527 | B2 | | 3/2016 | Gaynor | |
| 9,413,298 | B2 | | 8/2016 | Nobbe et al. | |

(Continued)

FOREIGN PATENT DOCUMENTS

| JP | 56164605 A | * | 12/1981 | ............. H03F 1/083 |

OTHER PUBLICATIONS

Tsai, et al., "A New Feedback Method for Power Amplifier with Unilateralization and Improved Output Return Loss", IEEE Transactions on Microwave Theory and Techniques, vol. 54, No. 4, Apr. 2006, pp. 1590-1597, 8 pgs.

*Primary Examiner* — Junpeng Chen
(74) *Attorney, Agent, or Firm* — Jaquez Land Greenhaus LLP; Alessandro Steinfl, Esq.

(57) ABSTRACT

Methods and devices for providing a feedback network in a multi-stage power amplifier are described. According to one aspect, a final amplifier of the multi-stage power amplifier is a cascode amplifier. The feedback network is placed between an output of the final amplifier and an output of a driver amplifier. The feedback network can decrease a mismatch between the output impedance of the final amplifier and a load presented to the final amplifier. In addition, the feedback network can change a load presented to the driver amplifier and thereby allow the transfer functions of each stage to be tuned so that the overall transfer function of the multi-stage amplifier becomes more linear.

15 Claims, 6 Drawing Sheets

(56) References Cited

U.S. PATENT DOCUMENTS

| | | |
|---|---|---|
| 9,602,063 B2 | 3/2017 | Kaatz et al. |
| 9,647,631 B2 | 5/2017 | Gaynor |
| 9,716,477 B2 | 7/2017 | Wagh et al. |
| 9,843,293 B1 | 12/2017 | Wagh et al. |
| 2010/0219887 A1* | 9/2010 | Ichitsubo ............. H03G 3/3036 |
| | | 330/124 R |
| 2017/0047463 A1* | 2/2017 | Hajimiri .................... H03F 3/19 |
| 2018/0083578 A1 | 3/2018 | Klaren et al. |
| 2018/0198424 A1* | 7/2018 | Sharma ................. H03F 1/0272 |

* cited by examiner

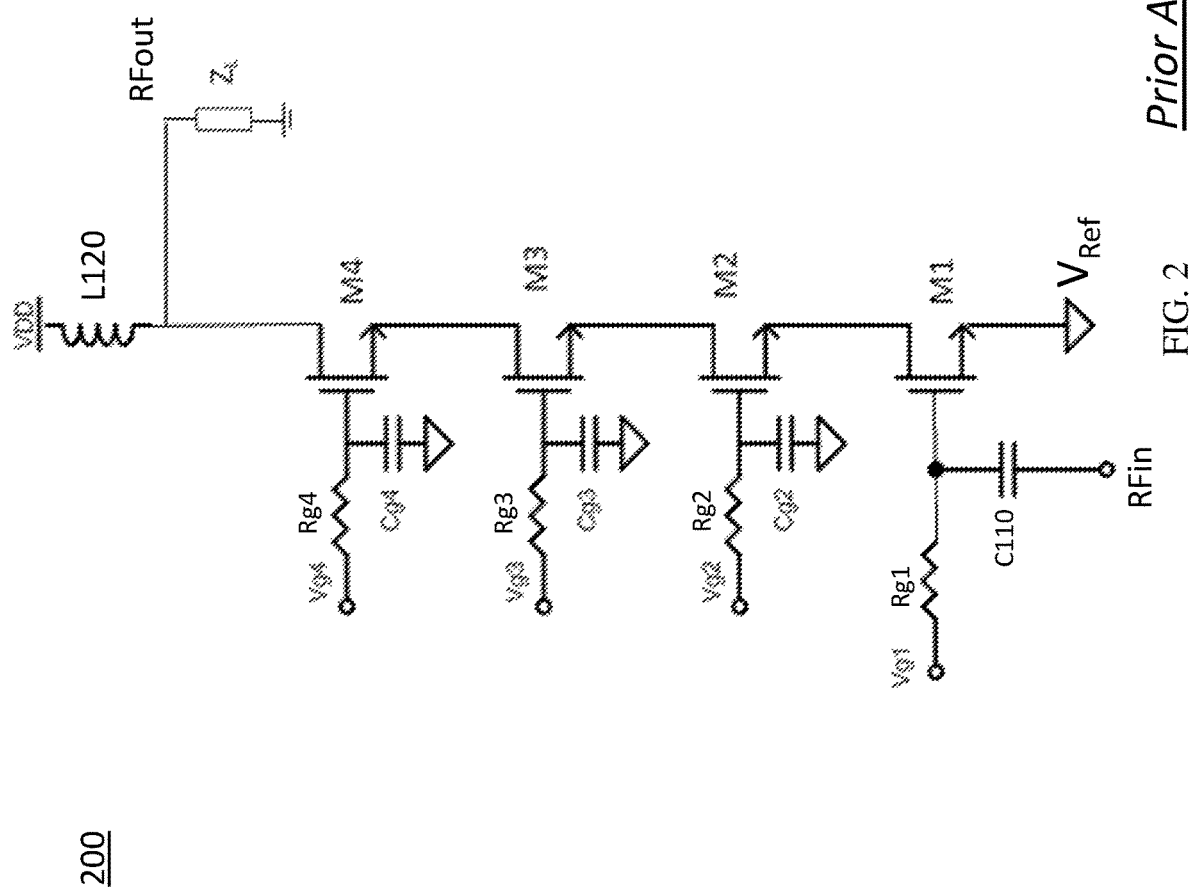
FIG. 2 *Prior Art*

MULTI-STAGE STACKED POWER AMPLIFIER FEEDBACK CIRCUIT FOR IMPROVED PERFORMANCE

CROSS REFERENCE TO RELATED APPLICATIONS

The present application may be related U.S. Pat. No. 9,843,293, entitled "Gate Drivers for Stacked Transistor Amplifiers", issued on Dec. 12, 2017, the disclosure of which is incorporated herein by reference in its entirety. The present application may also be related to U.S. Pat. No. 7,248,120, entitled "Stacked Transistor Method and Apparatus", issued on Jul. 24, 2007, the disclosure of which is incorporated herein by reference in its entirety. The present application may also be related to U.S. Pat. No. 9,716,477, entitled "Bias Control for Stacked Transistor Configuration", issued on Jul. 25, 2017, the disclosure of which is incorporated herein by reference in its entirety. The present application may also be related to U.S. Pat. No. 9,413,298, issued Aug. 9, 2016, entitled "Amplifier Dynamic Bias Adjustment for Envelope Tracking", the disclosure of which is incorporated herein by reference in its entirety. The present application may also be related to U.S. Patent Publication No. 2018/0083578, published Mar. 22, 2018, entitled "Cascode Amplifier Bias Circuits", the disclosure of which is incorporated herein by reference in its entirety. The present application may also be related to U.S. Pat. No. 9,602,063 entitled "Variable Impedance Match and Variable Harmonic Terminations for Different Modes and Frequency Bands", issued Mar. 21, 2017, the disclosure of which is incorporated herein by reference in its entirety. The present application may also be related to U.S. Pat. No. 9,647,631 entitled "Tunable Impedance Matching Network", issued May 9, 2017, the disclosure of which is incorporated herein by reference in its entirety. The present application may also be related to U.S. Pat. No. 9,276,527, issued on Mar. 1, 2016, entitled "Methods and Devices for Impedance Matching in Power Amplifier Circuits", the disclosure of which is incorporated herein by reference in its entirety. The present application may also be related to U.S. Pat. No. 9,024,700 B2 entitled "Method and Apparatus for use in Digitally Tuning a Capacitor in an Integrated Circuit Device", issued May 5, 2015, the disclosure of which is incorporated herein by reference in its entirety. The present application may also be related to U.S. Pat. No. 9,197,194 B2 entitled "Methods and Apparatuses for Use in Tuning Reactance in a Circuit Device", issued Nov. 24, 2015, the disclosure of which is incorporated herein by reference in its entirety.

TECHNICAL FIELD

The present teachings relate to RF (radio frequency) circuits. More particularly, the present teachings relate to methods and apparatuses for improving performance of a multi-stage stacked power amplifier (PA).

BACKGROUND

Radio frequency (RF) devices, such as cell phone transmitters, are becoming increasingly complex due to requirements to operate according to different modes of operation associated with, for example, additional frequency bands, more complex modulation schemes, higher modulation bandwidths, and the introduction of data throughput improvement schemes such as simultaneous RF transmission and/or reception within a same or different, but closely spaced, bands or channels within a band (e.g. voice, data), and aggregate transmission wherein information is multiplexed over parallel RF transmissions.

In order to achieve a required power output, amplifiers used in such RF devices may include a multi-stage arrangement of amplifiers wherein one or more of such amplifiers may be configured as a cascode amplifier comprising a plurality of stacked transistors in series connection. Such combination of a multi-stage arrangement of amplifiers with inclusion of one or more cascode amplifiers may affect output impedances of the different amplifier stages of the multi-stage arrangement and in turn produce impedance mismatches that can affect performance of the amplifier, such as, for example, output return loss and a voltage standing wave ratio (VSWR) performance.

It is therefore an object of the present disclosure to provide a solution to such impedance mismatch while reducing a performance degradation associated with the provided solution.

SUMMARY

According to a first aspect of the present disclosure, a radio frequency (RF) circuital arrangement is presented, comprising: a multi-stage power amplifier comprising: at least one final amplifier and one driver amplifier arranged in a cascaded configuration; a coupling network, comprising at least one capacitor, connected between an output node of the driver amplifier and an input node of the final amplifier; and a feedback network connected between the output node of the driver amplifier and an output node of the final amplifier, wherein the final amplifier is a cascode amplifier that comprises a plurality of stacked transistors, and wherein the multi-stage power amplifier is adapted to amplify a radio frequency (RF) signal at an input of the multi-stage power amplifier at a frequency of operation of 1 GHz or greater and output an amplified version of the RF signal at a power level of 15 dBm or greater into an output load of the multi-stage power amplifier.

According to a second aspect of the present disclosure, a method for improving performance of a multi-stage power amplifier is presented, the method comprising: providing a multi-stage power amplifier comprising a final amplifier and a driver amplifier that are arranged in a cascaded configuration and coupled to one another via coupling network; connecting a feedback network between an output node of the final amplifier and an output node of the driver amplifier; based on the connecting, reducing an impedance mismatch between an output load presented to the final amplifier and an output impedance of the final amplifier, thereby obtaining an improved performance of the multi-stage power amplifier; and based on the connecting, tuning an impedance of a load presented to the output node of the driver amplifier, thereby obtaining a further improved performance of the multi-stage power amplifier, wherein the final amplifier is a cascode amplifier that comprises a plurality of stacked transistors.

Further aspects of the disclosure are shown in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 2 shows a schematic diagram of an exemplary cascode amplifier comprising a plurality of stacked transistors.

DETAILED DESCRIPTION

Figure 1A:
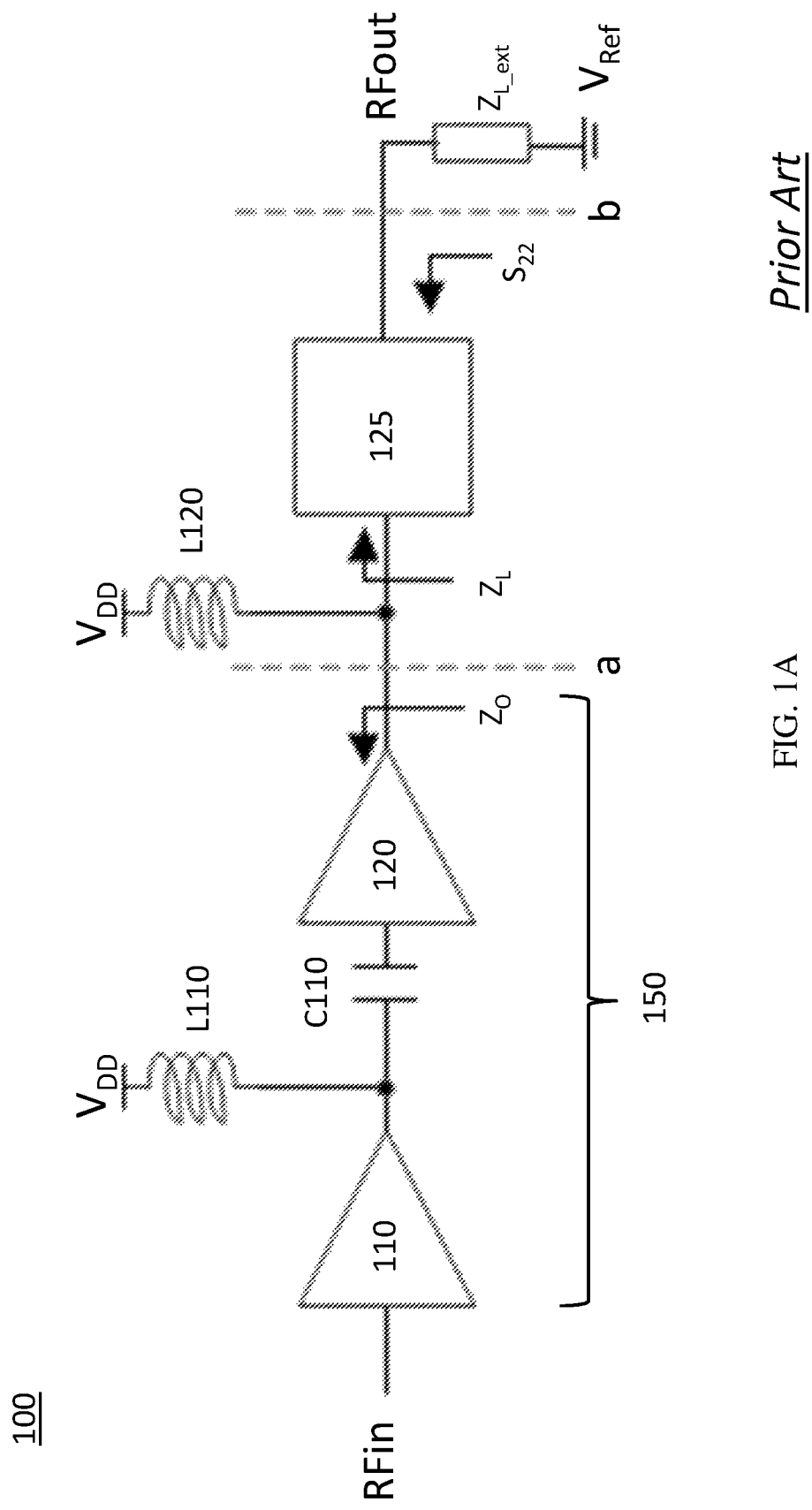
FIG. 1A shows a schematic diagram of a prior art multi-stage RF amplifier comprising a plurality of cascaded amplifiers that provide an amplified RF signal to a load via an output matching network.

Throughout this description, embodiments and variations are described for the purposes of illustrating uses and implementations of the inventive concept. The illustrative description should be understood as presenting examples of the inventive concept, rather than limiting the scope of the concept as disclosed herein.

The present disclosure describes electrical circuits in electronics devices (e.g., handheld cell phones, tablets, radios, etc.) having a plurality of devices, such as for example, transistors (e.g., MOSFETs). Persons skilled in the art will appreciate that such electrical circuits comprising transistors can be arranged as amplifiers. Such amplifiers may also be integrated in electronic modules that are used in, for example, handheld cell phones, tablets, radios, etc.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal.

Stacked transistor amplifiers, also known as cascode amplifiers, are described for example in U.S. Pat. No. 7,248,120, issued on Jul. 24, 2007, entitled "Stacked Transistor Method and Apparatus", the disclosure of which is incorporated herein by reference in its entirety.

The expression "multi-stage" amplifier as used in the present disclosure is intended to refer to an amplifier module that includes at least two cascaded amplifiers that are in series connection. Each of the cascaded amplifiers may be referred to herein as a "stage". As known in the art, such multi-stage amplifier may include a final amplifier stage whose input is coupled to an output of a driver amplifier stage. Any one or all of the stages may be a cascode amplifier comprising a plurality of stacked transistors.

As used herein, the term "power amplifier" (PA) is intended to refer to a multi-stage amplifier having at least two stages: a driver for receiving an input RF signal and a final for outputting an output RF signal that is an amplified version of the input RF signal. Larger number of stages, including additional pre-driver stages may be used as known to those skilled in the art. As used herein, a power amplifier is a multi-stage amplifier having an output power of 15 dBm or greater at a frequency of operation of 1 GHz or greater.

As used herein, the terms "multi-stage amplifier" and "power amplifier" are synonymous. In other words, throughout the present description, a multi-stage amplifier is a power amplifier having an output power of 15 dBm or greater at a frequency of operation of 1 GHz or greater, and a power amplifier is a multi-stage amplifier having an output power of 15 dBm or greater at a frequency of operation of 1 GHz or greater.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the terms "channel" and "band" are used interchangeably and can refer to a frequency range. More in particular, the terms "channel" and "band" as used herein refers to a frequency range that can be defined by a wireless standard such as, but not limited to, wideband code division multiple access (WCDMA) and long term evolution (LTE). In some cases, a frequency range of a band may be representative of frequencies of operation of a mode, and a frequency range of a channel may be contained within the frequency range of the band.

FIG. 1A shows a schematic diagram (100) of a prior art multi-stage RF amplifier (150) comprising a plurality of cascaded amplifiers (110, 120) that are configured to amplify an input RF signal, RFin, to provide an amplified RF signal, RFout, to an output load $Z_{L\_ext}$ that is coupled to an output of the multi-stage RF amplifier (150) via an output matching network (125). Such multi-stage RF amplifier (150) may be used as a power amplifier (PA) of an RF front-end stage of an RF device, such as, for example, of a cell phone transmitter.

Figure 1B:
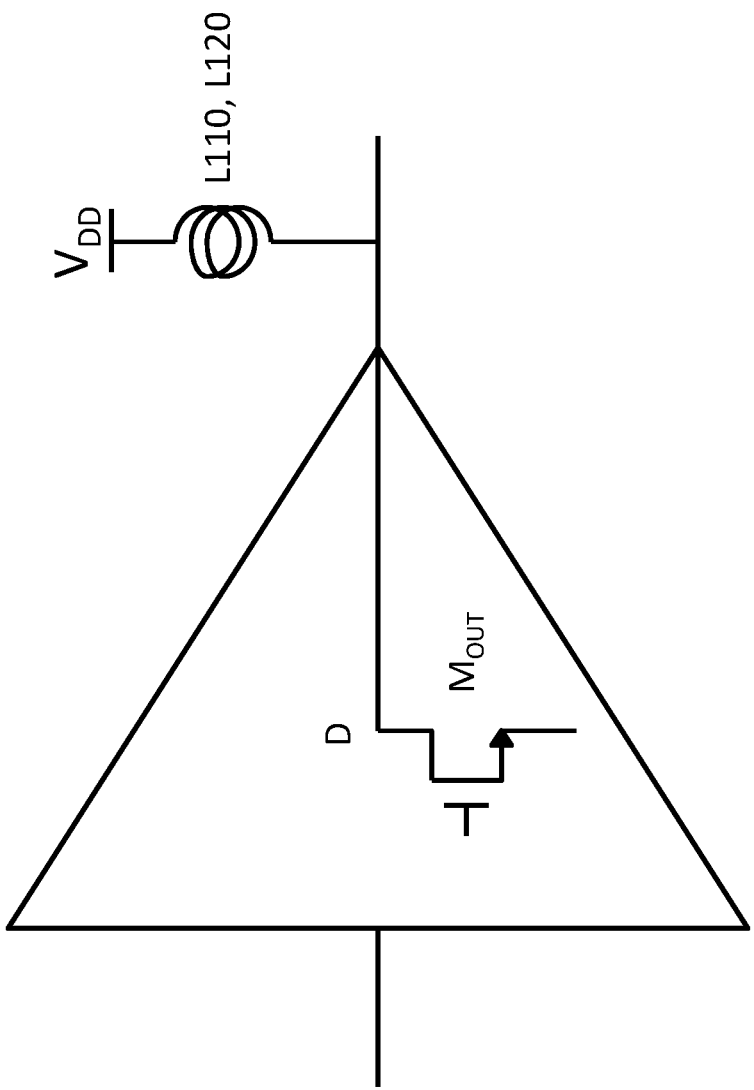
FIG. 1B shows an output transistor of an RF amplifier of FIG. 1A.

As can be seen in FIG. 1A, the multi-stage RF amplifier (150) may comprise a driver amplifier (110) and a final amplifier (120) that are coupled to one another via a simple inter-stage matching circuit consisting of a capacitor C110 and an inductor L110. Both the driver amplifier (110) and the final amplifier (120) may operate between a supply voltage $V_{DD}$ and a reference voltage Vref (e.g., AC ground). Coupling of the driver amplifier (110) and the final amplifier (120) to the supply voltage $V_{DD}$ may be through respective inductors L110 and L120. As shown in FIG. 1B, as it is well known in the art, the inductors L110 and L120 may be coupled between a drain node, D, of a respective output transistor, $M_{OUT}$, of the driver amplifier (110) and the final amplifier (120), and the supply voltage $V_{DD}$.

The output (impedance) matching network (125) of FIG. 1A couples an output of the final amplifier (120) to an output load $Z_{L\_ext}$. Such output load $Z_{L\_ext}$ may represent a load provided by a combination of electrical components coupled to the output matching network (125), such as, for example, duplexers, switches, antennae, or other components used in an RF transmitter as known to a person skilled in the art. A person skilled in the art is well aware of the benefits provided by the matching network (125), including impedance matching between the output of the final amplifier (120) and the output load, $Z_{L\_ext}$ at frequency ranges of interest, for an increase in transmitted signal level to the output load, $Z_{L\_ext}$, and a decrease in reflected signal level from the output load, $Z_{L\_ext}$.

With continued reference to FIG. 1A, the output match network (125) may be designed to transform an impedance of the output load, $Z_{L\_ext}$, such as to present a load, $Z_L$, to the output of the final stage (120), that is optimized with respect to well known in the art performance metrics, such as, for example, output power (Pout), linearity, or power added efficiency (PAE). As known to a person skilled in the art, such optimization may not necessarily yield to an impedance of the load $Z_L$ that is perfectly matched to an output impedance Zo of the final amplifier (120). In other words, the impedance of the load $Z_L$ may not necessarily be the complex conjugate of the output impedance Zo of the final amplifier (120). A person skilled in the art would clearly realize that absence of impedance match between Zo and $Z_L$ invariably results in absence of impedance match between output load $Z_{L\_ext}$ and the output port S22 of the output match network (125).

Absence of matching between the output impedance Zo and the impedance of the load $Z_L$ may induce other performance degradation, such as, for example, poor return loss, and an increase in a reflected signal level from the output load $Z_{L\_ext}$ back to the final amplifier (120). In some cases, such reflected signal level may be a function of small variation of the output load $Z_{L\_ext}$. Unfortunately, as described below, in cases where the final amplifier (120) is a cascode amplifier, impedance mismatch between Zo and $Z_L$, for a load $Z_L$ optimized for certain performance metrics, can be an increasing function of a corresponding transistor stack height of the cascode amplifier. In other words, a larger mismatch, with corresponding greater other performance degradation, is obtained for larger stack heights. A person skilled in the art would recognize that changing/varying load impedance $Z_L$ may affect performance of the multi-stage RF amplifier (150), and that reducing the output impedance mismatch due to such changing/varying of the load impedance $Z_L$ can reduce reflections that travel back to the amplifier (150), thereby leading to less sensitivity of the multi-stage RF amplifier (150) to load variations.

FIG. 2 shows a simplified schematic of a prior art cascode (RF) amplifier (200), which can be used as the final amplifier (120) of the multi-stage RF amplifier (150) of FIG. 1A. By way of example and not of limitation, the cascode amplifier (200) can comprise a stack of two or more transistors, such as, for example, the four FET transistors (M1, . . . , M4). An input RF signal, RFin, provided at a gate terminal of the input transistor M1 of the amplifier (200) is amplified by the amplifier (200). A corresponding amplified output RF signal, RFout, is provided at a drain of the output transistor, M4, and terminated into the load $Z_L$. The supply voltage, $V_{DD}$, is provided to the drain of the output transistor, M4, through an inductor, L120, and a reference voltage Vref (e.g., GND) is connected to a source of the input transistor M1. Biasing voltages at nodes (Vg4, Vg3, Vg2) are provided to respective gates of the cascode transistors (M4, M3, M2) via series resistors (Rg4, Rg3, Rg2). Biasing voltage to the input transistor, M1, can be provided at the node Vg1. Various biasing circuits to generate such gate voltages to the RF amplifier (200) are described, for example, in the above referenced U.S. Pat. Nos. 9,843,293, 7,248,120, 9,716,477, and U.S. Patent Publication No. 2018/0083578.

With further reference to the amplifier (200) depicted in FIG. 2, the biasing voltages at node (Vg2, Vg3, . . . , Vg4) may be such that each transistor (M1, M2, . . . , M4) of the stack is biased according to a voltage compliance of the transistor. In other words, a voltage across any two terminals (e.g., gate, source, and drain) of each transistor (M1, . . . , M4) is within a safe operating range of the transistor. As failure of transistor can be a statistical function of applied voltages across the transistors, even when such voltages are within the safe operating range, in some embodiments it may be desirable to subject the transistors of the stack to same voltage ranges so as to provide an equal life expectancy (e.g., mean time before failure) for each transistor of the stack. According to an exemplary embodiment, the gate biasing voltages at nodes (Vg2, Vg3, . . . , Vg4) can be configured to evenly distribute the voltage across the transistor stack, $V_{DD}$, amongst the stacked transistors (M1, M2, . . . , Mn). In other words, a drain to source voltage, VDS, of each transistor (M1, M2, . . . , M4) of the stack can be made to be substantially equal to a fraction (¼) of the voltage provided by the supply voltage $V_{CC}$. This can be extended to a stack of any height n, and therefore not limited to the specific example where n=4 as described with reference to FIG. 2. More related description can be found, for example, in the above referenced U.S. Pat. No. 9,716,477, whose disclosure is incorporated herein by reference in its entirety. According to other exemplary embodiments, unequal distribution of the voltage $V_{DD}$ amongst the stacked transistors may be provided, while operating each of the transistors of the stack within its safe operating range.

Although the amplifier (200) of FIG. 2 is shown to be powered by a fixed supply voltage $V_{DD}$, other configurations of the amplifier (200) where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, RFin, or the output RF signal, RFout. Detailed description of biasing methods and apparatus for stacked transistor amplifiers operating from a variable supply voltage can be found, for example, in the above referenced U.S. Pat. Nos. 9,413,298, 9,716,477, and 9,219,445, the disclosures of which are incorporated herein by reference in their entirety. A person skilled in the art would also know of configurations where the supply to the amplifier is in the form of a current source instead of the exemplary voltage source (e.g., VCC) discussed in the present disclosure. The teachings according to the present disclosure equally apply to such diverse supply configurations. The exemplary case of a fixed supply discussed in the present disclosure should not be considered as limiting what the applicant considers to be the invention.

It should be noted that although N-type MOSFETs are used in the exemplary RF amplifier (200) of FIG. 2, a person skilled in the art would recognize that other types of transistors such as, for example, P-type MOSFETs, can be used instead or in combination with the N-type MOSFETs. Furthermore, a person skilled in the art will also appreciate the advantage of stacking more than two transistors, such as three, four, five or more, provided on the voltage handling performance of the amplifier (200). In general, individual devices in the stack (e.g. M1, M2, M3, M4) can be constructed using CMOS (e.g., bulk, silicon-on sapphire (SOI), or other substrate variations known to a person skilled in the art), silicon germanium (SiGe), gallium arsenide (GaAs), gallium nitride (GaN), bipolar transistors, or any other viable semiconductor technology and architecture known. Additionally, different device sizes and types can be used within the stack of devices.

As known to a person skilled in the art, the higher voltage handling capability of the cascode amplifier (200) makes it suitable for usage as the final amplifier (120). However, as noted above, for a given performance metric of the multi-stage amplifier (150) of FIG. 1A, an optimal impedance $Z_{Lopt}$ of the load $Z_L$ may be increasingly mismatched with respect to the output impedance Zo of the final amplifier (120) as a function of an increasing stack height of the final amplifier (120). Applicant of the present disclosure have established that such mismatch may be approximated to a polynomial function, such as, for example, if the optimal impedance of the load $Z_L$ for a stack height of one is $Z_{Lopt}$, and the output impedance of the cascode amplifier (200) is $r_o$, then, for a same performance metric, the optimal impedance of the load $Z_L$ for a stack height of two, three, four, etc., is respectively $2Z_{Lopt}$, $3Z_{Lopt}$, $4Z_{Lopt}$, etc., and the output impedance of the cascode amplifier (200) may respectively be approximated to $k_1 a r_o$, $k_2 a^2 r_o^2$, $k_3 a^3 r_o^3$, $k_4 a^4 r_o^4$, etc., where $k_i$, a, and $r_0$ are constants. In other words, a higher performance degradation with respect to, for example, return loss and reflected signal, may be observed with higher stack heights.

Figure 3:
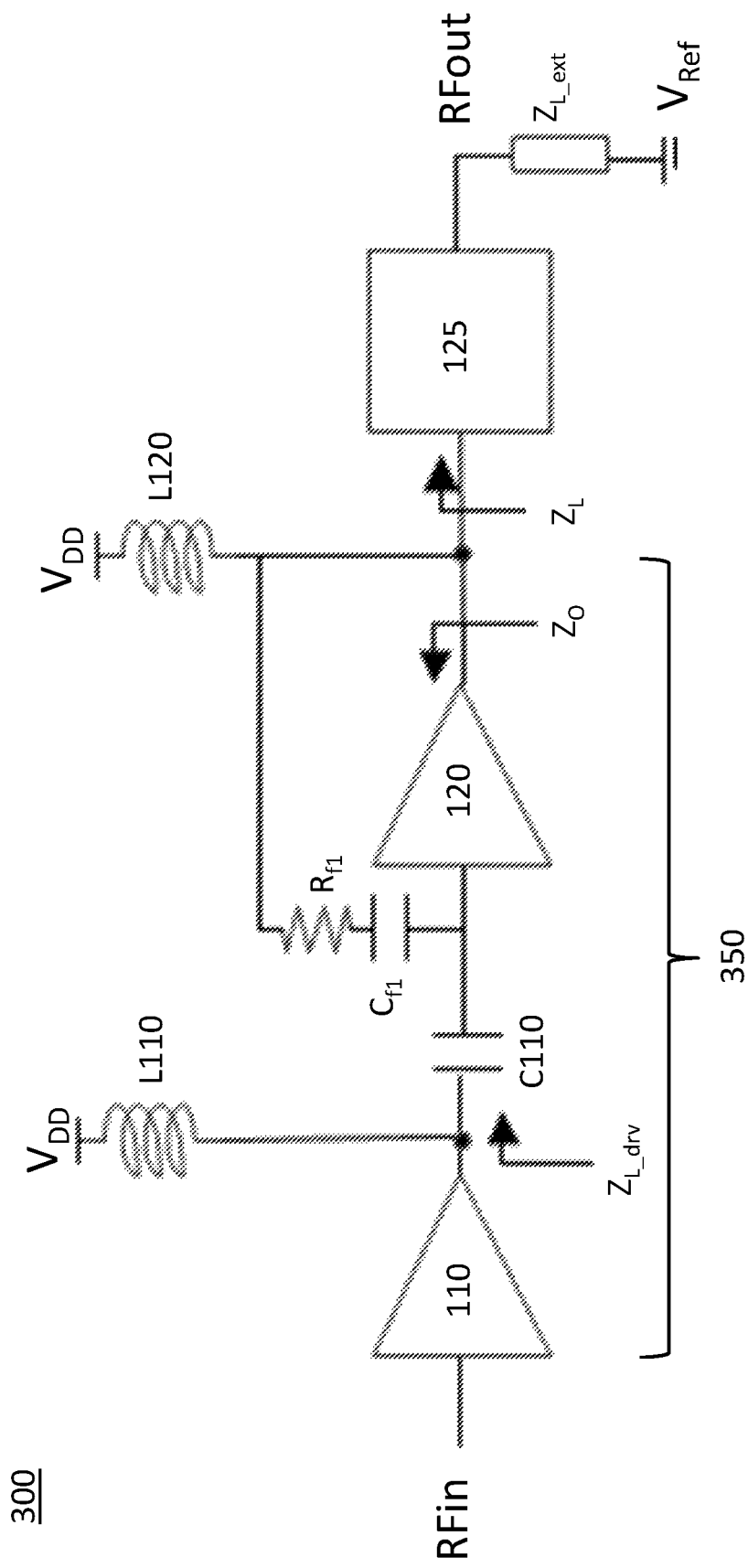
FIG. 3 shows a schematic diagram of a prior art multi-stage RF amplifier comprising a feedback network between an output and an input of a final amplifier of a multi-stage RF amplifier.

FIG. 3 shows a schematic diagram (300) of a prior art multi-stage RF amplifier (350) comprising a feedback network (Rf1, Cf1) between an output and an input of a final amplifier (120) of a multi-stage RF amplifier (350). As can be clearly understood by a person skilled in the art, the multi-stage RF amplifier (350) is the same as the multi-stage RF amplifier (150) of FIG. 1A, with the added feedback network (Rf1, Cf1). As it is well known in the art, such feedback network (Rf1, Cf1) may be designed to modify the output impedance Zo of the final amplifier (120) such as to decrease an impedance mismatch between the output impedance Zo and the impedance of the load $Z_L$ without affecting the load $Z_L$. Since the feedback is from the output to the input of the final amplifier (120), a DC blocking capacitor, Cf1, must be provided within the feedback path so to block a DC voltage present at the output of the final amplifier (120) (e.g., via inductor L120 coupled to $V_{DD}$). A person skilled in the art is well aware of drawback of such DC blocking capacitor mainly due to its relatively large physical size that may affect overall physical size of the multi-stage RF amplifier (350).

With continued reference to FIG. 3, a person skilled in the art would clearly realize that the feedback network (Rf1, Cf1) is substantially decoupled from the output of the driver amplifier (110), via for example, the capacitor C110, and therefore such feedback may not substantially affect inter-stage coupling between the driver amplifier (110) and the final amplifier (120). In other words, the feedback network (Rf1, Cf1) cannot be used to further tweak performance of the multi-stage amplifier (350) as affected by the inter-stage coupling between the driver amplifier (110) and the final amplifier (120). It should be noted that the capacitor C110 is one example of coupling between the driver amplifier (110) and the final amplifier (120), as other more complex coupling networks, such as for example, matching networks similar to the matching network (125), may be used instead. Some such matching networks are described, for example, in the above referenced U.S. Pat. Nos. 9,602,063, 9,647,631, and U.S. patent application Ser. No. 14/042,312, the disclosures of which are incorporated herein by reference in their entirety.

Figure 4:
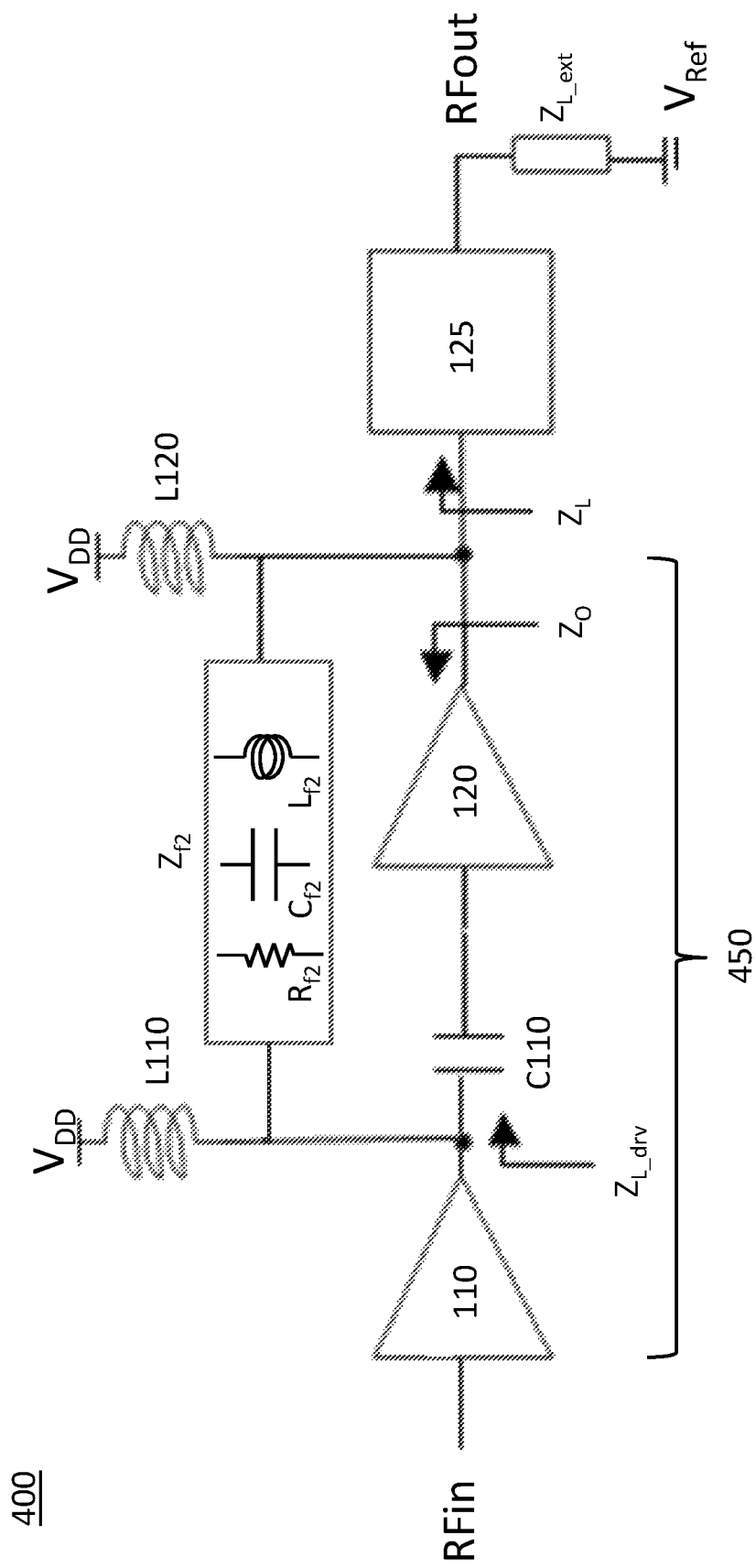
FIG. 4 shows a schematic diagram of a multi-stage RF amplifier according to an embodiment of the present disclosure, wherein a feedback network between an output of a final amplifier and an output of a driver amplifier is provided.

FIG. 4 shows a schematic diagram (400) of an exemplary multi-stage RF amplifier (450) according to the present disclosure, wherein a feedback network, Zf2, between the output of the final amplifier (120) and the output of the driver amplifier (110) is provided. Similar to the configuration depicted in FIG. 3, the feedback network Zf2 may be designed to modify the output impedance Zo of the final amplifier (120) such as to decrease an impedance mismatch between the output impedance Zo and the impedance of the load $Z_L$ without affecting the load $Z_L$. In particular, such network can be used in cases where the final amplifier (120) is a cascode amplifier as shown in FIG. 2, wherein, as discussed above, increasing impedance mismatch may be provided with increasing stack height in the absence of feedback.

With continued reference to FIG. 4, the feedback network Zf2 may be a passive network including any one of a capacitor Cf2, an inductor Lf2, and a resistor Rf2, arranged in one or more of series and/or parallel configurations, so to provide a desired impedance at a frequency of interest, such as the frequency of operation (e.g., in correspondence of a mode or a band) of the RFin and RFout signals. A person skilled in the art is well versed on design techniques for implementing such network Zf2 using combination of reactive elements (capacitors, inductors) and/or resistive elements (resistors), which design techniques are beyond the scope of the present disclosure. Some examples of combination of reactive and/or passive elements can be found, for example, in the above referenced U.S. Pat. Nos. 9,602,063, 9,647,631, and U.S. patent application Ser. No. 14/042,312, the disclosures of which are incorporated herein by reference in their entirety. Furthermore, such feedback network Zf2 may be a configurable/adjustable/tunable network via a combination of configurable/adjustable/tunable reactive and/or resistive elements, so to adapt to a frequency of interest associated to, for example, different modes and/or bands of operation of the multi-stage RF amplifier (450). Exemplary configurable/adjustable/tunable reactive elements may include a digitally tunable capacitor (DTC) or a digitally tunable inductor (DTL) as described, for example, in the above referenced U.S. Pat. No. 9,024,700 B2 and U.S. Pat. No. 9,197,194 B2, the disclosures of which are incorporated herein by reference in their entirety. It should be noted that the feedback network Zf2, may include, in a simple embodiment according to the present teachings, a single resistor, or a single inductor, and not necessarily other combined passive/reactive elements. Complexity of the feedback network may be based on a combination of a mismatch amount (e.g., stack height) between the output impedance Zo of the final amplifier (120) and the impedance of the load $Z_L$, as well as a desired degree of performance compensation (later described) based on the inter-stage interaction between the driver amplifier (110) and the final amplifier (120).

It should be noted that the feedback network Zf2 of FIG. 4 is between two output nodes that are at a substantially same DC level, since both outputs of the driver amplifier (110) and the final amplifier (120) are coupled to a same supply voltage $V_{DD}$ via respective inductors L110 and L120. Accordingly, in the feedback configuration according to the present teachings shown in FIG. 4, there is no need for a DC blocking capacitor (e.g., C110 of FIG. 3) as the feedback network Zf2 is coupled between nodes of a substantially same DC level. A person skilled in the art would clearly appreciate such advantage provided by the teachings according to the present disclosure which do not require the bulky DC blocking capacitor Cf1 of the prior art configuration shown in FIG. 3. Accordingly, the multi-stage RF amplifier (450) according to the present disclosure can advantageously be fabricated physically more compact when compared with the prior art multi-stage RF amplifier (350) of FIG. 3, and therefore fit within a smaller physical space.

With further reference to FIG. 4, as can be clearly understood by a person skilled in the art, since the feedback network Zf2 is directly coupled (connected to) the output of the driver amplifier (110), it can affect impedance of a load $Z_{L\_drv}$ that the driver amplifier (110) sees, and therefore in contrast to the prior art configuration of FIG. 3, can substantially affect inter-stage coupling between the driver amplifier (110) and the final amplifier (120). According to an exemplary embodiment of the present disclosure, the feedback network Zf2 may can be used to tune the impedance of the output load $Z_{L\_drv}$ so to decrease signal compression at the output of the multi-stage amplifier (450), and therefore increase linearity of said amplifier. Furthermore, the feedback network Zf2 according to the present teachings can allow tuning of transfer functions of each of the stages (110) and (120) so that a more linear overall transfer function of the multi-stage RF amplifier (450) is provided.

Figure 5:
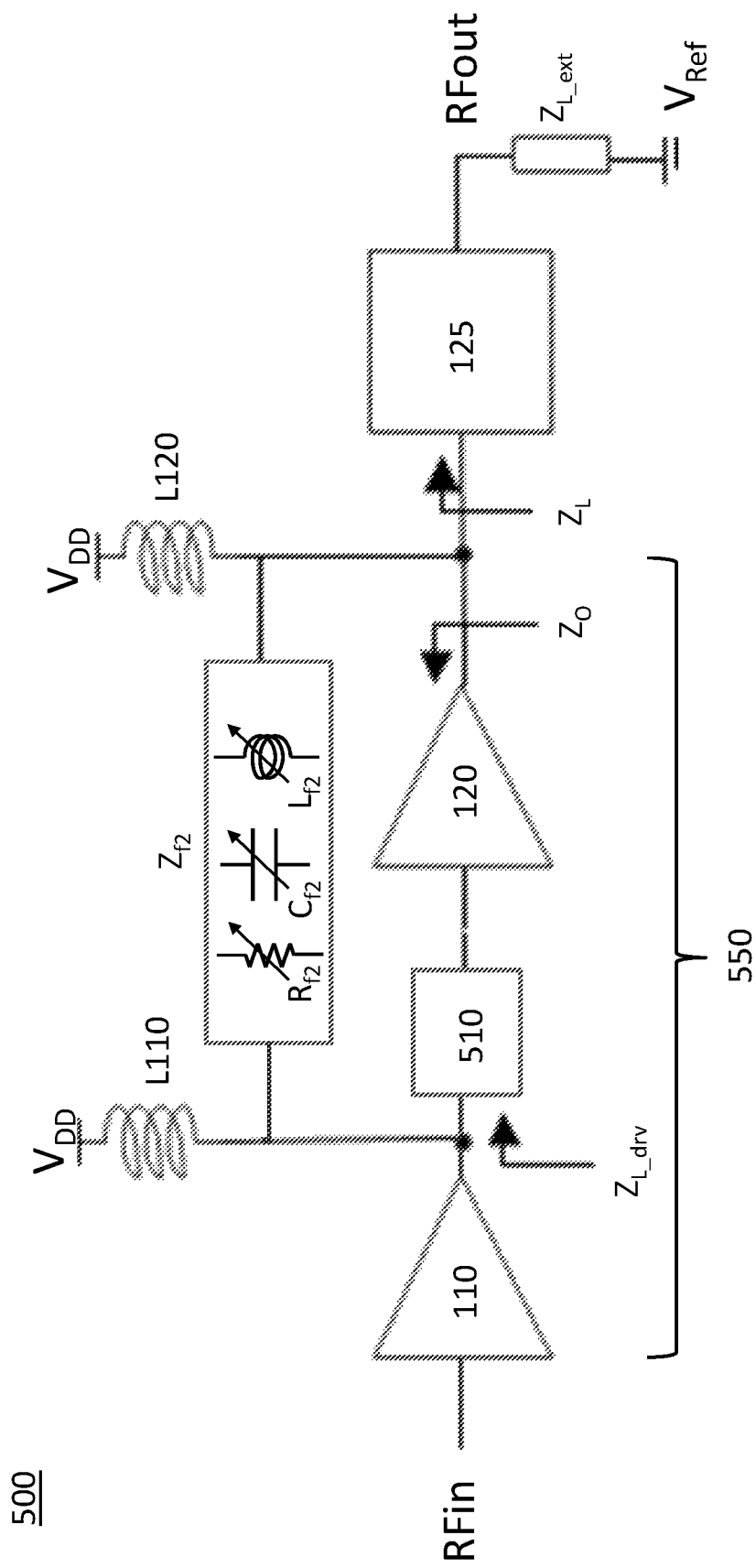
FIG. 5 shows a schematic diagram of a multi-stage RF amplifier according to an embodiment of the present disclosure, wherein a feedback network between an output of a final amplifier and an output of a driver amplifier is provided, and wherein coupling between a final amplifier and a driver amplifier of the multi-stage RF amplifier is provided via a matching network.

FIG. 5 shows a schematic diagram (500) of a multi-stage RF amplifier (550) according to an embodiment of the present disclosure, wherein, similar to the embodiment depicted in FIG. 4, a feedback network Zf2 between an output of a final amplifier (120) and an output of a driver amplifier (110) is provided. However, in contrast to the embodiment depicted in FIG. 4, coupling between the final amplifier (120) and the driver amplifier (110) of the multi-stage RF amplifier (550) is provided via a matching (coupling) network (510), and not a simple capacitor C110 per FIG. 4. A person skilled in the art would clearly understand that principle of operation of the multi-stage RF amplifier (550) remains same as one described above with respect to the multi-stage RF amplifier (450) of FIG. 4, wherein the feedback network Zf2 can be used to decrease mismatch between Zo and $Z_L$, while further allowing tuning of the load impedance $Z_{L\_drv}$ seen by the output of the driver amplifier (110) with benefits as described above. A person skilled in the art would clearly understands that the matching network (510) plays a similar role as the matching network (125) described above but for matching output impedance of the driver amplifier (110) to the input impedance of the final amplifier (120). It should be noted that, as it should be clear to a person skilled in the art, that the matching network (510) may include at least one capacitor that is configured to block a DC level at the output of the driver amplifier (110), in a manner similar to the capacitor C110 described above with reference to FIG. 4.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:
1. A radio frequency (RF) circuital arrangement, comprising:
   a multi-stage power amplifier comprising:
      at least one final amplifier and one driver amplifier arranged in a cascaded configuration;

a coupling network, comprising at least one capacitor, connected between an output node of the driver amplifier and an input node of the final amplifier; and a feedback network connected between the output node of the driver amplifier and an output node of the final amplifier, wherein the final amplifier is a cascode amplifier that comprises a plurality of stacked transistors, and wherein the multi-stage power amplifier is configured to amplify a radio frequency (RF) signal at an input of the multi-stage power amplifier at a frequency of operation of 1 GHz or greater and output an amplified version of the RF signal at a power level of 15 dBm or greater into an output load of the multi-stage power amplifier.

2. The radio frequency (RF) circuital arrangement according to claim 1, wherein the feedback network comprises at least one of: a) a resistor, b) a capacitor, c) and inductor, and d) a combination of one or more of a)-c).

3. The radio frequency (RF) circuital arrangement according to claim 1, wherein the output node of the final amplifier is coupled to a supply voltage via an inductor.

4. The radio frequency (RF) circuital arrangement according to claim 2, wherein the feedback network is designed to reduce an impedance mismatch between the output load and an output impedance of the final amplifier.

5. The radio frequency (RF) circuital arrangement according to claim 4, wherein the feedback network is further designed to tune an impedance of a load presented to the output node of the driver amplifier so to reduce an output return loss of the multi-stage power amplifier.

6. The radio frequency (RF) circuital arrangement according to claim 5, wherein a tuned impedance of the load is based on a combination of an input impedance of the coupling network and an impedance of the feedback network at the frequency of operation.

7. The radio frequency (RF) circuital arrangement according to claim 2, further comprising a matching network connected at the output node of the final amplifier.

8. The radio frequency (RF) circuital arrangement according to claim 2, wherein the feedback network is a tunable network with respect to different frequencies of operation of the RF signal.

9. The radio frequency (RF) circuital arrangement according to claim 8, wherein tuning of the tunable network is based on at least one of: a) an adjustable resistor, b) a digitally tunable capacitor (DTC), and c) a digitally tunable inductor (DTL).

10. The radio frequency (RF) circuital arrangement according to claim 2, wherein the circuital arrangement is monolithically integrated.

11. The radio frequency (RF) circuital arrangement according to claim 2, wherein the plurality of stacked transistors are FET transistors.

12. The radio frequency (RF) circuital arrangement according to claim 11, wherein the FET transistors are fabricated using one of: a) silicon-on-insulator (SOI) technology, and b) silicon-on-sapphire technology (SOS).

13. An electronic module comprising the radio frequency (RF) circuital arrangement according to claim 2.

14. A handheld cellular phone comprising the electronic module of claim 13.

15. A radio frequency (RF) transmitter comprising the radio frequency (RF) circuital arrangement according to claim 2.

* * * * *